(12) United States Patent
Jang et al.

(10) Patent No.: US 11,825,719 B2
(45) Date of Patent: Nov. 21, 2023

(54) LIGHT EMITTING DISPLAY DEVICE

(71) Applicant: LG Display Co., Ltd., Seoul (KR)

(72) Inventors: Hun Jang, Paju-si (KR); Daeyoung Seo, Paju-si (KR); Soyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 258 days.

(21) Appl. No.: 17/517,676

(22) Filed: Nov. 3, 2021

(65) Prior Publication Data

US 2022/0208878 A1    Jun. 30, 2022

(30) Foreign Application Priority Data

Dec. 31, 2020 (KR) ........................ 10-2020-0189724

(51) Int. Cl.
*H10K 59/35* (2023.01)
*H10K 59/131* (2023.01)
*H10K 71/00* (2023.01)
*H10K 59/12* (2023.01)

(52) U.S. Cl.
CPC ......... *H10K 59/353* (2023.02); *H10K 59/131* (2023.02); *H10K 59/351* (2023.02)

(58) Field of Classification Search
CPC .. H10K 59/131; H10K 59/351; H10K 59/353; H10K 71/861; G09G 3/3225
See application file for complete search history.

(56) References Cited

U.S. PATENT DOCUMENTS

| 10,236,335 B2 | 3/2019 | Oh et al. |
| 2014/0239823 A1* | 8/2014 | Ahn ..................... G09G 3/3233 |
| | | 315/161 |
| 2018/0151126 A1* | 5/2018 | Jeong .................... H01L 27/124 |
| 2018/0151661 A1* | 5/2018 | Oh ......................... H01L 27/124 |
| 2018/0174510 A1* | 6/2018 | Lim ....................... G09G 3/006 |
| 2021/0013289 A1* | 1/2021 | Li ......................... G09G 3/3233 |
| 2021/0202683 A1* | 7/2021 | Lee ...................... H10K 59/131 |

FOREIGN PATENT DOCUMENTS

| KR | 10-2017-0080745 A | | 7/2017 | |
| KR | 10-2018-0062516 A | | 6/2018 | |
| KR | 20190013167 A | * | 2/2019 | .......... H10K 59/353 |

* cited by examiner

*Primary Examiner* — Mohsen Ahmadi
(74) *Attorney, Agent, or Firm* — Fenwick & West LLP

(57) ABSTRACT

A light emitting display device comprises a subpixel having a light emitting element disposed in a light emission area on a substrate and a circuit area in which a circuit for driving the light emitting element is disposed, a gate line disposed in the circuit area in a first direction, and at least one power line disposed in a second direction crossing the first direction, the at least one power line including a first power bridge line and a second power bridge line which are spaced apart from each other in the first direction.

17 Claims, 9 Drawing Sheets

LIGHT EMITTING DISPLAY DEVICE

CROSS-REFERENCE TO RELATED APPLICATIONS

This application claims the benefit of the Korean Patent Application No. 10-2020-0189724 filed on Dec. 31, 2020, which is hereby incorporated by reference as if fully set forth herein.

BACKGROUND

Field of the Invention

The present disclosure relates to a light emitting display device.

Discussion of the Related Art

With the advancement of the information age, the demand for a display device for displaying an image has increased with various forms. Therefore, various types of display devices such as a liquid crystal display (LCD) device, a plasma display panel (PDP) device and an organic light emitting display (OLED) device have been recently used.

Among such display devices, an organic light emitting display device is a self-luminance display device which injects holes from an anode electrode and electrons from a cathode electrode into a light emitting layer and emits light when an exciton generated by combination of the injected holes and electrons falls from an excited state to a ground state.

As the organic light emitting display device is developed with a large area and/or an ultra-high resolution structure, a size of a pixel is reduced, and a high aperture ratio structure is required to increase a ratio of an opening area within the pixel. In case of the ultra-high resolution, as the number of pixels is increased, the probability of occurrence of a defect in a pixel is increased.

The defect may include a point defect such as a color defect of each pixel, a bright point (always turned on), a dark point (always turned off), a short circuit between adjacent wires, and a line defect due to disconnection (open). In case of a dark point defect, it is possible to repair a dark point pixel so as not to be perceived by a user by connecting the dark point pixel with another adjacent pixel of the same color as that of the dark point pixel. In case of a line defect of a gate line, power wiring lines connected to peripheral pixels may be cut to bypass the disconnected gate line and connect the disconnected gate line by welding so as to repair the line defect of the gate line. However, problems occur in that all of the pixels around the power wiring lines used as a bypass path may become dark points, and an aperture ratio of subpixels is reduced to ensure a margin for performing a repair process.

The disclosure of the above-described background art is owned by the inventor of the present disclosure to devise the present disclosure or is technical information acquired by a process of devising the present disclosure, but cannot be regarded as known art disclosed to the general public before the present disclosure is disclosed.

SUMMARY

The present disclosure has been made in view of the above problems and it is an object of the present disclosure to provide a light emitting display device that may improve an aperture ratio in a limited space of a subpixel and perform a repair process in response to various types of defects.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display device comprising a subpixel having a light emitting element disposed in a light emission area on a substrate and a circuit area in which a circuit for driving the light emitting element is disposed, a gate line disposed in the circuit area in a first direction, and at least one power line disposed in a second direction crossing the first direction, the at least one power line including a first power bridge line and a second power bridge line which are spaced apart from each other in the first direction.

In accordance with another aspect of the present disclosure, the above and other objects can be accomplished by the provision of a light emitting display device comprising a plurality of subpixels disposed in a pixel area defined by a gate line, a data line, a driving power line and a reference line, each subpixel having a light emission area and a circuit area, wherein the gate line may be disposed in the circuit area along a first direction, the driving power line and the reference line may be disposed in parallel in a second direction crossing the first direction, the driving power line may include a first driving power bridge line and a second driving power bridge line, which are spaced apart from each other in a length direction of the gate line and extend in the second direction, and the reference line may include a first reference bridge line and a second reference bridge line, which are spaced apart from each other in the length direction of the gate line and extend in the second direction.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
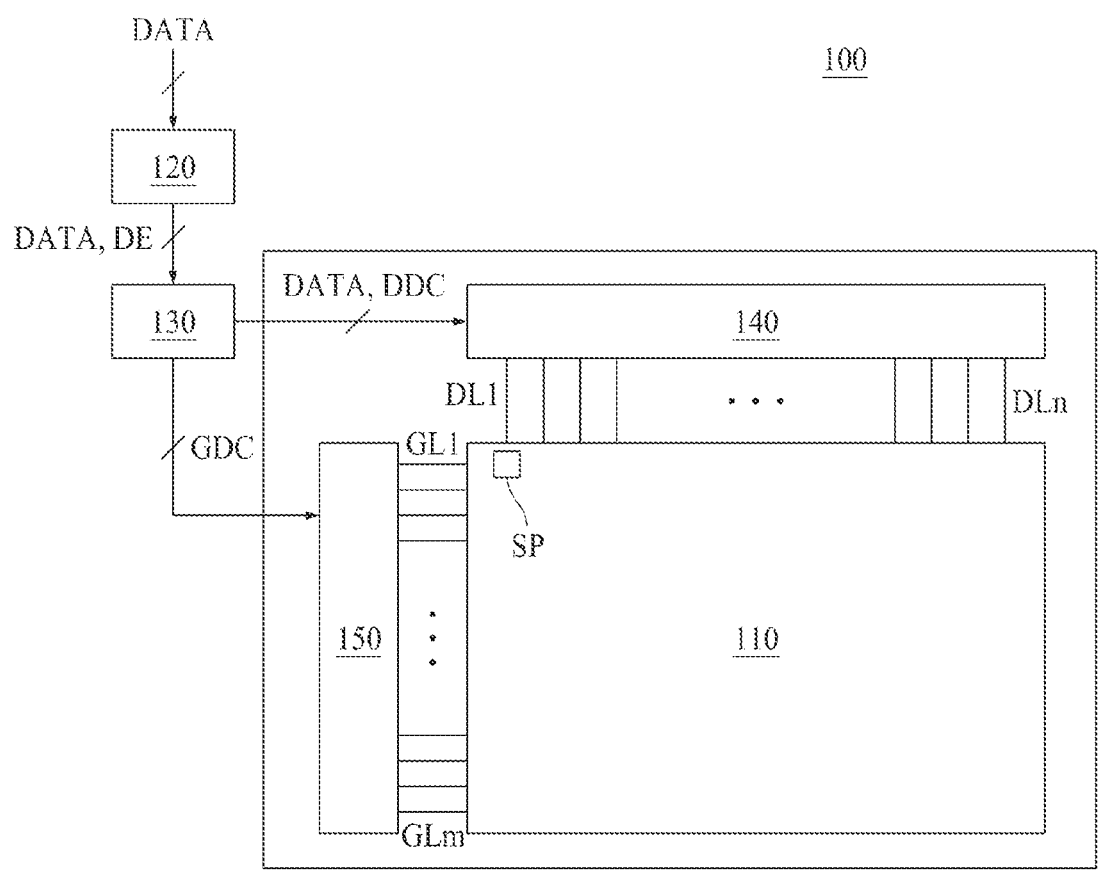
FIG. 1 is a schematic block view illustrating a light emitting display device according to various embodiments of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, a preferred embodiment of a light emitting display device according to various embodiments of the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
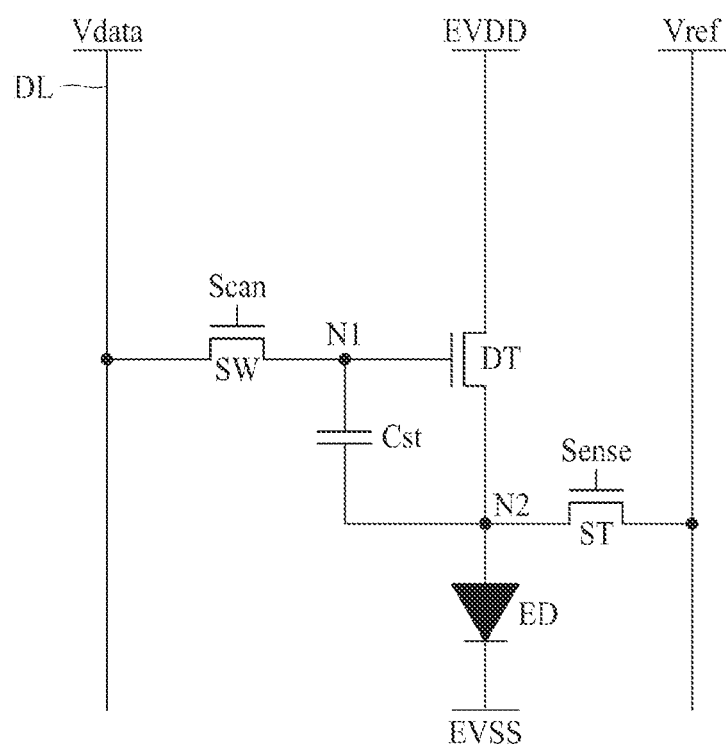
FIG. 2 is a circuit view illustrating an example of a subpixel of a light emitting display device according to various embodiments of the present disclosure.

FIG. 1 is a schematic block view illustrating a light emitting display device according to various embodiments of the present disclosure. FIG. 2 is a circuit view illustrating an example of a subpixel of a light emitting display device according to various embodiments of the present disclosure.

Referring to FIGS. 1 and 2, a light emitting display device 100 according to various embodiments of the present disclosure may include a display panel 110, an image processor 120, a timing controller 130, a data driving circuit 140, and a gate driving circuit 150.

The display panel 110 may display an image in response to a data signal DATA and a gate signal, which are supplied from the data driving circuit 140 and the gate driving circuit 150. The display panel 110 may include subpixels SP that operate to display an image.

The subpixels SP may be embodied in a top emission method, a bottom emission method, or a dual emission method in accordance with a structure. The subpixels SP may include a red subpixel, a white subpixel, a blue subpixel and a green subpixel, or may include a red subpixel, a green subpixel and a blue subpixel. The subpixels SP may have one or more different light emission areas in accordance with light emission characteristics.

The image processor 120 may output a data enable signal DE together with the data signal DATA supplied from the outside. The image processor 120 may output one or more of a vertical synchronization signal, a horizontal synchronization signal and a clock signal in addition to the data enable signal DE and the data signal DATA, but these signals are not shown for convenience of description.

The timing controller 130 may be supplied with the data signal DATA together with a driving signal, which includes the data enable signal DE or the vertical synchronization signal, the horizontal synchronization signal and the clock signal, from the image processor 120. The timing controller 130 may output a data timing control signal DDC for controlling an operation timing of the data driving circuit 140 and a gate timing control signal GDC for controlling an operation timing of the gate driving circuit 150, based on the driving signal.

The data driving circuit 140 may sample and latch the data signal DATA supplied from the timing controller 130 in response to the data timing control signal DDC supplied from the timing controller 130, and may convert the latched data signal into a gamma reference voltage and output the gamma reference voltage. The data driving circuit 140 may output the data signal DATA through data lines DL1 to DLn. The data driving circuit 140 may be embodied in the form of an integrated circuit (IC).

The gate driving circuit 150 may output the gate signal in response to the gate timing control signal GDC supplied from the timing controller 130. The gate driving circuit 150 may output the gate signal through gate lines GL1 to GLm. The gate driving circuit 150 may be embodied in the form of an integrated circuit (IC), or may be embodied in the display panel 110 in a gate-in-panel (GIP) type.

As shown in FIG. 2, one subpixel SP constituting a unit pixel may include a light emitting element ED, a driving thin film transistor DT for driving the light emitting element ED, a switching thin film transistor SW for transferring a data signal (or data voltage) to a first node N1 of the driving thin film transistor DT corresponding to a gate node of the driving thin film transistor DT, a storage capacitor Cst for maintaining a data signal corresponding to an image signal voltage or a voltage corresponding to the data signal for one frame period, and a sensing thin film transistor ST disposed between a second node N2 of the driving thin film transistor DT and a reference voltage Vref.

The light emitting element ED may include a pixel electrode (first electrode or anode electrode), a light emitting layer (or organic light emitting layer), a common electrode (second electrode or cathode electrode), and the like. For example, the light emitting element ED may be an organic light emitting diode (OLED). A low potential voltage EVSS may be connected to a common electrode of the light emitting element ED. The driving thin film transistor DT may supply a driving current to the light emitting element ED to drive the light emitting element ED.

A first electrode and a second electrode of the driving thin film transistor DT may be disposed between a high potential voltage EVDD and the second node N2, and its gate electrode may be connected to the first node N1.

A first electrode and a second electrode of the switching thin film transistor SW may be electrically connected between a data line DL for supplying a data signal Vdata and the first node N1 of the driving thin film transistor DT, and its gate electrode may be connected to a gate line GL for applying a scan signal Scan. The switching thin film transistor SW may be controlled by the scan signal Scan. The switching thin film transistor SW may be turned on by the scan signal Scan to transfer the data signal Vdata supplied from the data line DL to the first node N1 of the driving thin film transistor DT.

The storage capacitor Cst may be electrically connected between the first node N1 and the second node N2 of the driving thin film transistor DT.

A first electrode and a second electrode of the sensing thin film transistor ST may be disposed between the second node N2 and the reference voltage Vref, and its gate electrode may be connected to a gate line GL for applying a sensing signal Sense. The sensing thin film transistor ST may be turned on by the sensing signal Sense to use the reference voltage Vref supplied through a reference line as one of a voltage sensing path for the second node N2 of the driving thin film transistor DT.

Each of the scan signal Scan and the sensing signal Sense may be a separate gate signal. In this case, the scan signal Scan and the sensing signal Sense may respectively be applied to the gate electrode of the switching thin film transistor SW and the gate electrode of the sensing thin film transistor ST through their respective gate lines different from each other. Alternatively, the scan signal Scan and the sensing signal Sense may be the same gate signals that are not separately classified.

In the example of FIG. 2, a subpixel that includes a pixel driving circuit of 3T1C structure (three transistors T and one capacitor C) that includes a light emitting element ED, a driving thin film transistor DT, a switching thin film transistor SW, a sensing thin film transistor ST and a storage capacitor Cst has been described as an example, but the pixel driving circuit of each subpixel may be configured in various structures such as 2T1C, 3T2C, 4T2C, 5T1C and 6T2C depending on a configuration of a compensation circuit.

The subpixel SP may be supplied with a high potential voltage EVDD (or first power voltage) and a low potential voltage EVSS (or second power voltage), which are required for driving, from a power supply (not shown). The high potential voltage generated in the power supply may be supplied to the pixel electrode (first electrode or anode electrode) of the light emitting element ED through a driving power line, and the low potential voltage may be supplied to the common electrode (second electrode or cathode electrode) of the light emitting element ED through the driving power line.

Figure 3:
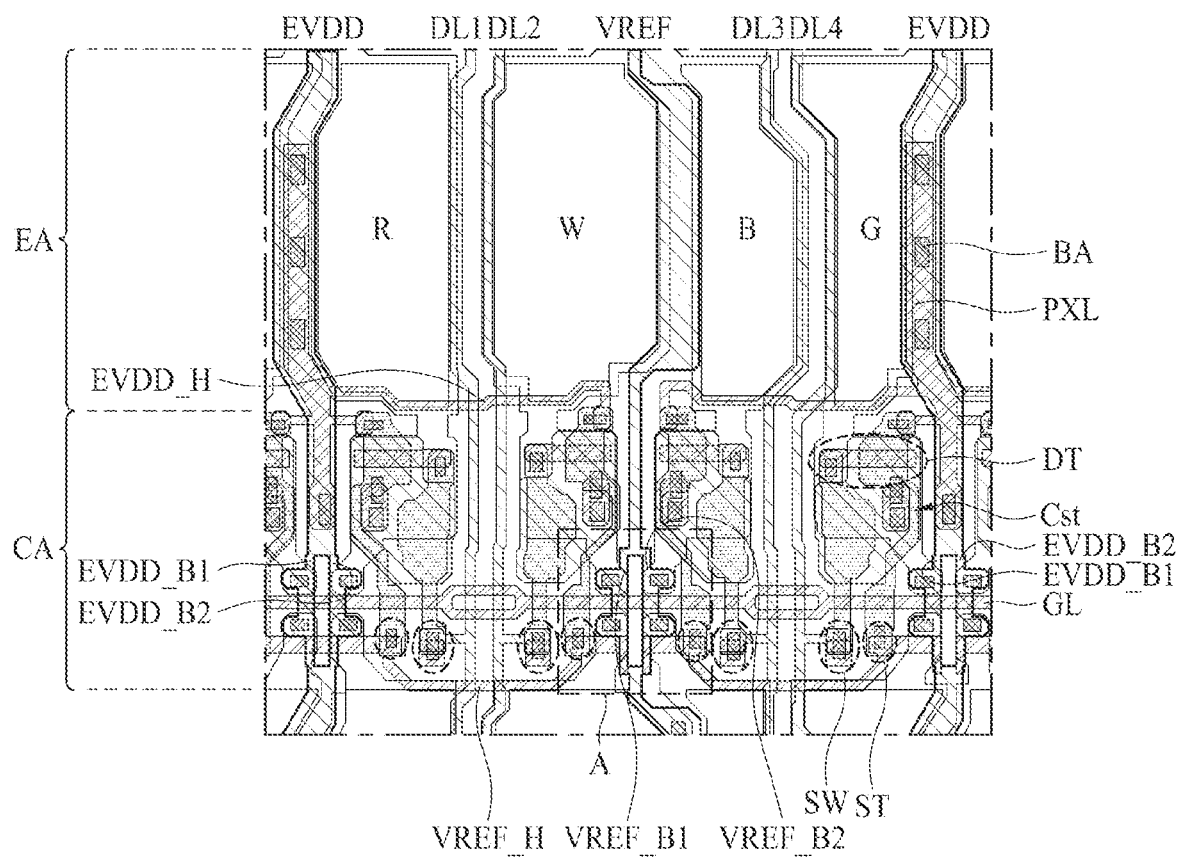
FIG. 3 is a plane view illustrating a unit pixel of a light emitting display device according to one embodiment of the present disclosure.
Figure 4:
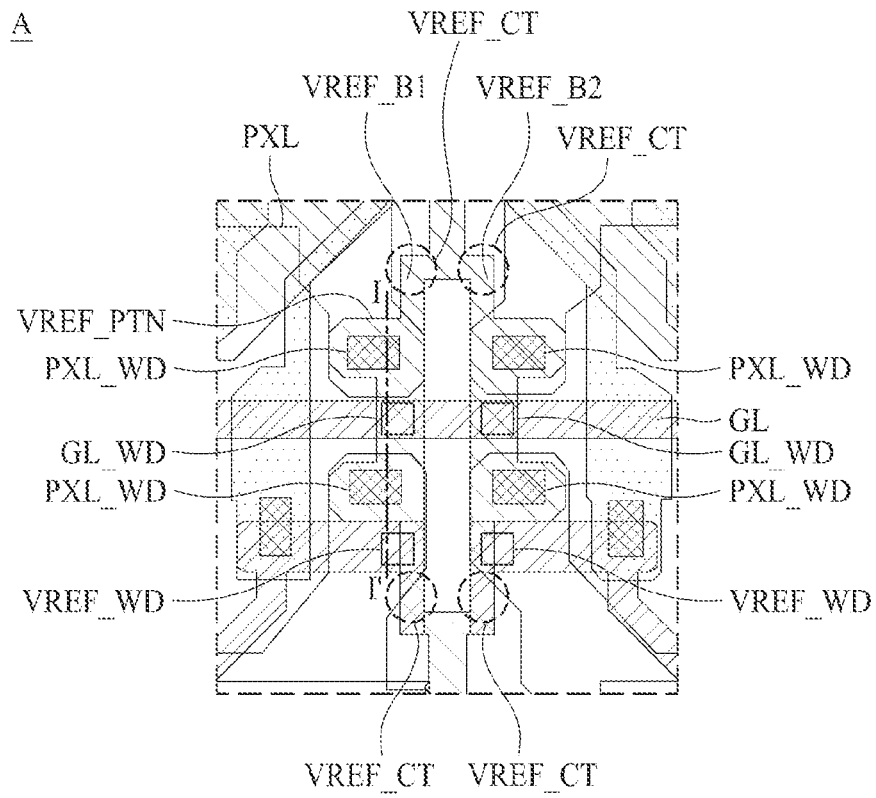
FIG. 4 is an enlarged view illustrating a portion A of FIG. 3.
Figure 5:
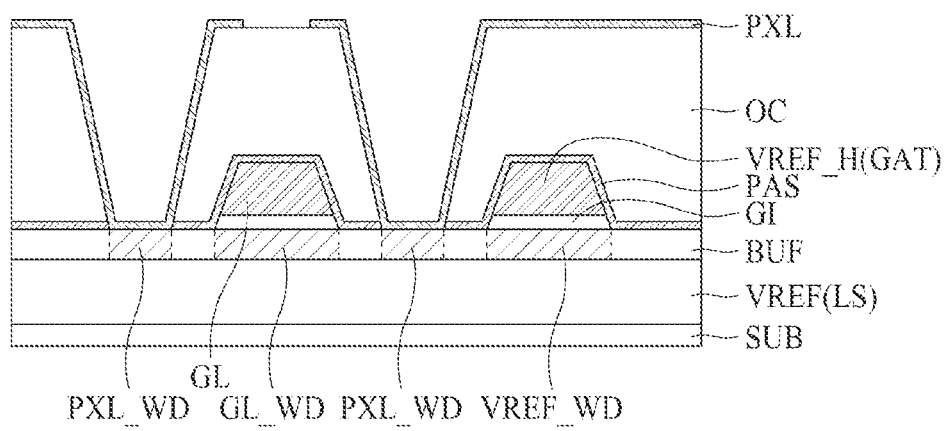
FIG. 5 is a cross-sectional view taken along line I-I' of FIG. 4.
Figure 6:
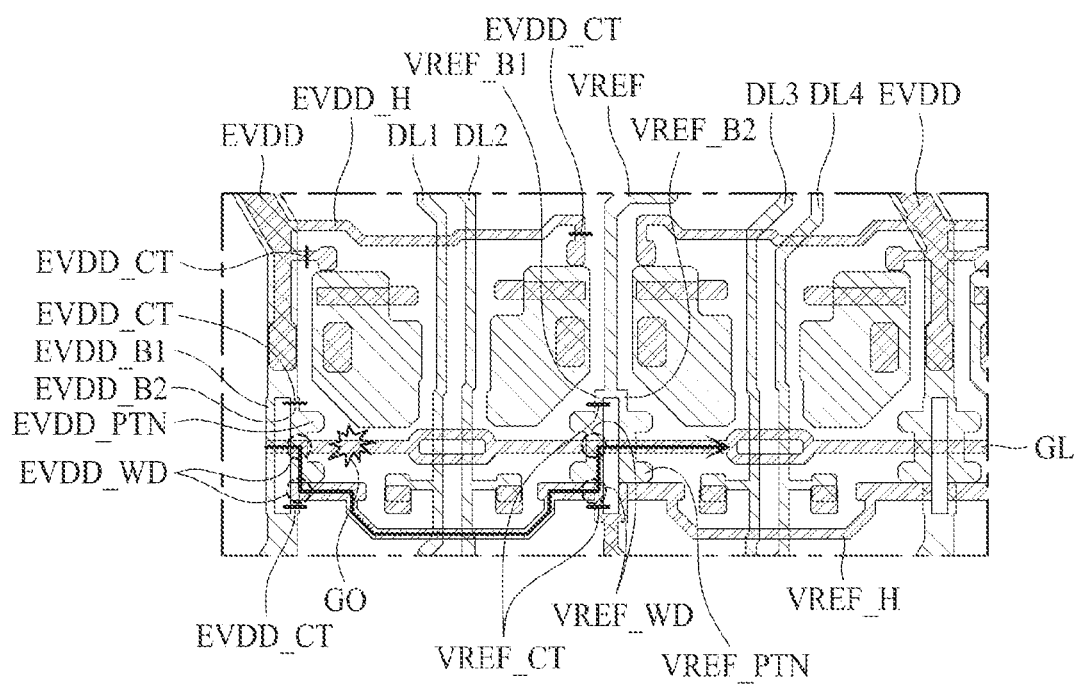
FIG. 6 is a view illustrating a repair process of a light emitting display device according to one embodiment of the present disclosure.

FIG. 3 is a plane view illustrating a unit pixel of a light emitting display device according to one embodiment of the present disclosure. FIG. 4 is an enlarged view illustrating a portion A of FIG. 3. FIG. 5 is a cross-sectional view taken along line I-I' of FIG. 4. FIG. 6 is a view illustrating a repair process of a light emitting display device according to one embodiment of the present disclosure.

Referring to FIG. 3, the light emitting display device according to one embodiment of the present disclosure may include first to fourth (four) subpixels SP1, SP2, SP3, and SP4 which constitute one unit pixel and are indicated by R, W, B and G in FIG. 3, respectively, a plurality of driving power lines EVDD, data lines DL1, DL2, DL3 and DL4, a gate line GL and a reference line VREF.

The subpixels SP1, SP2, SP3 and SP4 constituting one unit pixel may repeatedly be arranged to be spaced apart from one another along a first direction (or horizontal direction) to constitute one horizontal line. The array of the subpixels in one horizontal line may repeatedly be applied along a second direction (or vertical direction) crossing the first direction to form a pixel array that includes subpixels SP1, SP2, SP3 and SP4 of a plurality of horizontal lines.

Each of the subpixels SP1, SP2, SP3 and SP4 may include a light emission area EA in which a light emitting element is disposed, and a circuit area CA in which a pixel driving circuit for driving the light emitting element is disposed.

The light emission area EA may be an opening area defined by a bank BA. For example, the bank BA may define the light emission area EA by covering an edge of the pixel electrode PXL (first electrode or anode electrode). The circuit area CA may be a cover area covered by the bank BA.

In each of the subpixels SP1, SP2, SP3 and SP4, the light emission area EA is an opening area in which an upper surface of the pixel electrode PXL is exposed by the bank BA, and a pixel electrode PXL, a light emitting layer (or organic light emitting layer) on the pixel electrode PXL, and a common electrode (second electrode or cathode electrode) on the light emitting layer may sequentially be deposited in the light emission area EA to generate and emit light.

In each of the subpixels SP1, SP2, SP3 and SP4, the circuit area CA is an area in which the edge of the pixel electrode PXL is covered by the bank BA or the pixel electrode PXL is not disposed, and since the light emitting layer and the common electrode are not in contact with the pixel electrode PXL in the circuit area CA, light may not be generated.

The pixel driving circuit may be disposed in the circuit area CA. As shown in FIG. 2, the pixel driving circuit may include a driving thin film transistor DT for driving a light emitting device ED, a switching thin film transistor SW and a sensing thin film transistor ST as a switching circuit for controlling the driving thin film transistor DT, and a storage capacitor Cst for supplying a data voltage Vdata stored therein to the driving thin film transistor DT.

The plurality of driving power lines EVDD may extend in parallel along a second direction (or vertical direction) with first to fourth (four) subpixels SP1, SP2, SP3 and SP4 constituting one unit pixel, and subpixels SP1, SP2, SP3 and SP4 are interposed between the driving power lines EVDD. The plurality of driving power lines EVDD may be delimited with adjacent unit pixels in a first direction (or horizontal direction). For example, the plurality of driving power lines EVDD may be disposed on a left side of the first subpixels SP1 and a right side of the fourth subpixels SP4 for each of the plurality of horizontal lines arranged in the second direction (or vertical direction). An auxiliary driving power line EVDD_H extending in the first direction (or horizontal direction) and electrically connected to each of the driving power lines EVDD of left and right sides may be provided between the plurality of driving power lines EVDD. The auxiliary driving power line EVDD_H may be provided to connect the plurality of driving power lines EVDD to each other. Alternatively, the auxiliary driving power line EVDD_H may extend from the driving power line EVDD at the left side to the right side, or vice versa. For example, the auxiliary driving power line EVDD_H extending from the left driving power line EVDD may be electrically connected to the first subpixel SP1 and the second subpixel SP2, and the auxiliary driving power line EVDD_H extending from the right driving power line EVDD may be electrically connected to the third subpixel SP3 and the fourth subpixel SP4.

The plurality of driving power lines EVDD may be connected to the driving thin film transistor DT disposed in the circuit area of the first to fourth subpixels SP1, SP2, SP3 and SP4 through the auxiliary driving power line EVDD_H.

In the display device according to various embodiments of the present disclosure, the driving power line EVDD may diverge into a first driving power bridge line EVDD_B1 (or first power bridge line) and a second driving power bridge line EVDD_B2 (or second power bridge line), which are spaced apart from each other in the first direction (or horizontal direction) in some segments, and the first and second driving power bridge lines may extend in the second direction (or vertical direction) and then be integrally connected to each other. For example, the first driving power bridge line EVDD_B1 and the second driving power bridge line EVDD_B2 may be disposed to overlap the gate line GL. A central portion of the first driving power bridge line EVDD_B1 and the second driving power bridge line EVDD_B2 may be overlapped with the gate line GL, and may extend to diverge into upper and lower portions of the gate line GL at a predetermined distance.

The first and second driving power bridge lines EVDD_B1 and EVDD_B2 may include their respective driving power protrusion patterns EVDD_PTN (or protrusion patterns) protruded to be opposite to each other. The driving power protrusion pattern EVDD_PTN may be disposed at a position that does not overlap with the gate line GL on the first and second driving power bridge lines EVDD_B1 and EVDD_B2, and may be disposed on both sides of the gate line GL, that is, the upper portion and the lower portion, respectively.

The driving power protrusion patterns EVDD_PTN may overlap their respective pixel electrodes PXL of subpixels different from each other. For example, the driving power protrusion pattern EVDD_PTN positioned at the upper portion of the gate line GL may overlap the pixel electrode PXL of the first subpixel SP1 disposed in the upper horizontal line, and the driving power protrusion pattern EVDD_PTN positioned at the lower portion of the gate line GL may overlap the pixel electrode PXL of the first subpixel SP1 disposed in the lower horizontal line.

The data lines DL1, DL2, DL3 and DL4 may be disposed in parallel with each other so that the data lines DL1, DL2, DL3 and DL4 may extend along a second direction (or vertical direction) between the first and second subpixels SP1 and SP2 and between the third and fourth subpixels SP3 and SP4. For example, the first and second data lines DL1 and DL2 may be disposed in parallel between the first and second subpixels SP1 and SP2, and the third and fourth data lines DL3 and DL4 may be disposed in parallel between the third and fourth subpixels SP3 and SP4. Each of the data lines DL1, DL2, DL3 and DL4 may supply the data signal to the switching thin film transistor SW disposed in the circuit area CA of adjacent subpixels SP1, SP2, SP3 and SP4.

The gate line GL may extend across the circuit area CA of the first to fourth (four) subpixels SP1, SP2, SP3 and SP4 constituting one unit pixel along a first direction (or a horizontal direction).

The reference line VREF may be disposed between the plurality of driving power lines EVDD and may extend in the second direction (or vertical direction). For example, the reference line VREF may be disposed in parallel with the driving power lines EVDD between the second subpixel SP2 and the third subpixel SP3. The reference line VREF may include an auxiliary reference line VREF_H (or auxiliary power line) extending in the first direction (or horizontal direction) toward the left and right sides. The auxiliary reference line VREF_H may extend to the left and right from the reference line VREF. The reference line VREF may be connected to the sensing thin film transistor ST disposed in the circuit area CA of the first to fourth subpixels SP1, SP2, SP3 and SP4 through the auxiliary reference line VREF_H.

In the display device according to various embodiments of the present disclosure, the reference line VREF may diverge into a first reference bridge line VREF_B1 (or first power bridge line) and a second reference bridge line VREF_B2 (or second power bridge line), which are spaced apart from each other in the first direction (or horizontal direction) in some segments, and the first and second reference bridge lines may extend in the second direction (or vertical direction) and then be integrally connected with each other. For example, the first reference bridge line VREF_B1 and the second reference bridge line VREF_B2 may be disposed to overlap the gate line GL. A central portion of the first reference bridge line VREF_B1 and the second reference bridge line VREF_B2 may overlap the gate line GL, and may extend to diverge into upper and lower portions of the gate line GL at a predetermined distance.

The first and second reference bridge lines VREF_B1 and VREF_B2 may include their respective reference protrusion patterns VREF_PTN (or protrusion patterns) protruding to be opposite to each other. The reference protrusion pattern VREF_PTN may be disposed at a position that does not overlap with the gate line GL on the first and second reference bridge lines VREF_B1 and VREF_B2, and may be disposed on both sides of the gate line GL, that is, the upper portion and the lower portion, respectively.

The reference protrusion patterns VREF_PTN may overlap their respective pixel electrodes PXL of subpixels different from each other. For example, the reference protrusion pattern VREF_PTN positioned at the upper portion of the gate line GL may overlap the pixel electrode PXL of the third subpixel SP3 disposed in the upper horizontal line, and the reference protrusion pattern VREF_PTN positioned at the lower portion of the gate line GL may overlap the pixel electrode PXL of the third subpixel SP3 disposed in the lower horizontal line.

The auxiliary reference line VREF_H may extend from the reference line VREF, and may extend in a direction toward the first subpixel SP1 and in a direction toward the fourth subpixel SP4, respectively.

A portion of the auxiliary reference line VREF_H, which extends to one side (or left side) from the reference line VREF, may overlap the second driving power bridge line EVDD_B2 of the driving power line EVDD positioned at the left side, and may overlap the first reference bridge line VREF_B1 of the reference line VREF.

A portion of the auxiliary reference line VREF_H, which extends to the other side (or right side) from the reference line VREF, may overlap the first driving power bridge line EVDD_B1 of the driving power line EVDD positioned on the right side, and may overlap the second reference bridge line VREF_B2 of the reference line VREF.

The first driving power bridge line EVDD_B1 of the driving power line EVDD positioned at the left side may overlap the auxiliary reference line VREF_H of another pixel, which is adjacent thereto at the left side and disposed on the same horizontal line.

The second driving power bridge line EVDD_B2 of the driving power line EVDD positioned at the right side may overlap the auxiliary reference line VREF_H of another pixel, which is adjacent thereto at the right side and disposed on the same horizontal line.

The auxiliary reference line VREF_H may overlap only one of the first driving power bridge line EVDD_B1 or the second driving power bridge line EVDD_B2 of the driving power line EVDD. Each of the first and second driving power bridge lines EVDD_B1 and EVDD_B2 belonging to the same driving power line EVDD may overlap with the auxiliary reference line VREF_H. For example, the auxiliary reference lines VREF_H extending from different reference lines VREF may overlap each of the first and second driving power bridge lines EVDD_B1 and EVDD_B2 belonging to the same driving power line EVDD.

The auxiliary reference line VREF_H may overlap only one of the first reference bridge line VREF_B1 or the second reference bridge line VREF_B2 of the reference line VREF. Each of the first and second reference bridge lines VREF_B1 and VREF_B2 belonging to the same reference line VREF may be overlapped with the auxiliary reference line VREF_H. For example, the auxiliary reference line VREF_H extending from the reference line VREF in different directions may overlap each of the first and second reference bridge lines VREF_B1 and VREF_B2 belonging to the same reference line VREF.

According to various embodiments of the present disclosure, the first and second driving power bridge lines EVDD_B1 and EVDD_B2 belonging to the driving power line EVDD and the first and second reference bridge lines VREF_B1 and VREF_B2 belonging to the reference line VREF may have substantially the same structure. Although FIGS. 4 and 5 show enlarged sections of only the first and second reference bridge lines VREF_B1 and VREF_B2 belonging to the reference line VREF, this structure may equally be applied to the first and second driving power bridge lines EVDD_B1 and EVDD_B2 belonging to the driving power line EVDD.

Referring to FIGS. 4 and 5, the reference line VREF according to one embodiment of the present disclosure may diverge into a first reference bridge line VREF_B1 (or first power bridge line) and a second reference bridge line VREF_B2 (or second power bridge line), which are spaced apart from each other in the first direction (or horizontal direction) in some segments, and the first and second reference bridge lines may extend in the second direction (or vertical direction) and then integrally connected to each other. For example, the first reference bridge line VREF_B1 and the second reference bridge line VREF_B2 may be disposed to overlap the gate line GL. A central portion of the first reference bridge line VREF_B1 and the second reference bridge line VREF_B2 may overlap the gate line GL, and may extend to diverge into the upper and lower portions of the gate line GL at a predetermined distance.

The first and second reference bridge lines VREF_B1 and VREF_B2 may include their reference protrusion patterns VREF_PTN (or protrusion patterns) protruding to be opposite to each other. The reference protrusion pattern VREF_PTN may be disposed at a position that does not overlap with the gate line GL on the first and second reference bridge lines VREF_B1 and VREF_B2, and may be disposed on both sides of the gate line GL, that is, the upper and lower portions, respectively.

For example, the reference protrusion pattern VREF_PTN positioned at the upper portion of the first reference bridge line VREF_B1 may overlap the pixel electrode PXL of the second subpixel SP2. The reference protrusion pattern VREF_PTN positioned at the lower portion of the first reference bridge line VREF_B1 may overlap the pixel electrode PXL of the second subpixel SP2, which is adjacent thereto in the second direction (or vertical direction) and disposed on the lower horizontal line.

In addition, the reference protrusion pattern VREF_PTN positioned at the upper portion of the second reference bridge line VREF_B2 may overlap the pixel electrode PXL of the third subpixel SP3. The reference protrusion pattern VREF_PTN positioned at the lower portion of the second reference bridge line VREF_B1 may overlap the pixel electrode PXL of the third subpixel SP3, which is adjacent thereto in the second direction (or vertical direction) and disposed on the lower horizontal line.

As shown in FIG. 4, a cutting area VREF_CT and welding areas GL_WD and VREF_WD may be disposed in the first and second reference bridge lines VREF_B1 and VREF_B2 to repair disconnection (open) of the gate line GL when the disconnection occurs in the gate line GL.

The cutting area VREF_CT may be positioned at a portion adjacent to the reference line VREF at both ends of the first reference bridge line VREF_B1 and the second reference bridge line VREF_B2.

In the cutting area VREF_CT of the first and second reference bridge lines VREF_B1 and VREF_B2, any one of the first and second reference bridge lines VREF_B1 and VREF_B2 may be cut and the other one may not be cut. That is, a portion of the cutting area VREF_CT of the first and second reference bridge lines VREF_B1 and VREF_B2, which is cut, loses a function of its original reference line VREF, and may serve as a bypass path of the disconnected gate line GL. On the other hand, a portion of the cutting area VREF_CT of the first and second reference bridge lines VREF_B1 and VREF_B2, which is not cut, may serve as its original reference line VREF.

The welding areas GL_WD and VREF_WD may be positioned at a portion overlapped with the gate line GL and a portion overlapped with the auxiliary reference line VREF_H in the first reference bridge line VREF_B1 and the second reference bridge line VREF_B2. For example, a welding process for the welding areas GL_WD and VREF_WD may be performed after cutting of the cutting area VREF_CT has been performed.

The welding process for the welding areas GL_WD and VREF_WD may be performed in both the portion that is overlapped with the gate line GL and the portion that is overlapped with the auxiliary reference line VREF_H.

When the cutting and welding processes are performed in the second reference bridge line VREF_B2 of the first and second reference bridge lines VREF_B1 and VREF_B2, the second reference bridge line VREF_B2 may be a bypass path of the disconnected gate line GL, and the gate signal supplied from the gate line GL of a previous portion of the disconnected gate line GL may be applied to the auxiliary reference line VREF_H through the second reference bridge line VREF_B2. At this time, the cutting and welding processes may equally be performed even in the first driving power bridge line EVDD_B1 overlapped with the auxiliary reference line VREF_H, whereby the gate signal applied through the auxiliary reference line VREF_H may be transferred to the gate line GL of a subsequent portion of the disconnected gate line GL.

The welding area PXL_WD for the pixel electrode PXL may be disposed in the reference protrusion pattern VREF_PTN (or protrusion pattern) protruding from the first and second reference bridge lines VREF_B1 and VREF_B2.

In the welding area PXL_WD of the pixel electrode PXL, the pixel electrode PXL of the subpixel arranged on the upper horizontal line may be electrically connected with the pixel electrode PXL of the subpixel arranged on the lower horizontal line, whereby a welding process for repairing a dark point defect for one of the upper and lower subpixels may be performed.

Even though the first and second reference bridge lines VREF_B1 and VREF_B2 are intended for connection of the upper and lower pixel electrodes PXL, the cutting process may be performed for the cutting area VREF_CT of any one of the first and second reference bridge lines VREF_B1 and VREF_B2 corresponding to the subpixel of which dark point is to be repaired. The welding process for the welding area PXL_WD of the pixel electrode PXL of the cut area of the first and second reference bridge lines VREF_B1 and VREF_B2 may be performed, whereby the dark point defect may be repaired.

As shown in FIG. 5, the first and second reference bridge lines VREF_B1 and VREF_B2 may be disposed on the substrate SUB. The first and second reference bridge lines VREF_B1 and VREF_B2 may be formed by a light shielding layer LS. A buffer layer BUF and a gate insulating layer GI may be disposed on the first and second reference bridge lines VREF_B1 and VREF_B2. The gate line GL and the auxiliary reference line VREF_H may be disposed on the gate insulating layer GI. A passivation layer PAS may be disposed on the gate line GL and the auxiliary reference line VREF_H to electrically protect the gate line GL and the auxiliary reference line VREF_H. An overcoat layer OC may be disposed on the passivation layer PAS, and the pixel electrode PXL may be disposed on the overcoat layer OC.

The buffer layer BUF, the gate insulating layer GI, the passivation layer PAS, the overcoat layer OC, etc. may be disposed between the reference protrusion pattern VREF_PTN (or protrusion pattern) of the first and second reference bridge lines VREF_B1 and VREF_B2 and the pixel electrode PXL as at least one insulating layer. At this time, the welding area PXL_WD of the pixel electrode PXL may include a groove in which a portion of at least one insulating layer is recessed. For example, the groove passes through the overcoat layer OC and the passivation layer PAS, and the pixel electrode PXL corresponding to the groove may be disposed on the buffer layer BUF in contact with the buffer layer BUF. This is to make welding more actively and prevent other elements from being damaged by making the distance between the first and second reference bridge lines VREF_B1 and VREF_B2 and the pixel electrode PXL close when the laser is irradiated from the lower portion of the substrate for the welding process.

A repair process in which disconnection occurs in a gate line in a light emitting display device according to one embodiment of the present disclosure will be described with reference to FIG. 6.

In FIG. 6, it is assumed that a disconnection defect GO of the gate line GL occurs in the first subpixel SP1. The first subpixel SP1 in which the disconnected gate line GL is positioned and the second subpixel SP2 adjacent to the first subpixel SP1 may be dark point areas for repairing the disconnection defect of the gate line GL.

A cutting area EVDD_CT positioned at both ends of the second driving power bridge line EVDD_B2 of the driving power line EVDD overlapped with a previous portion of the disconnected gate line GL may be cut. A cutting area VREF_CT positioned at both ends of the first reference bridge line VREF_B1 of the reference line VREF that is overlapped with a subsequent portion of the disconnected gate line GL may be cut.

In addition, since the functions of the first subpixel SP1 and the second subpixel SP2 have been lost, the cutting area EVDD_CT may be cut for the auxiliary driving power line EVDD_H for applying a driving power to the driving thin film transistor DT. In this case, cutting may be omitted depending on the conditions of the repair process.

Then, the welding process may be performed for the welding area EVDD_WD positioned in an area where the second driving power bridge line EVDD_B2 and the gate line GL overlap each other and an area where the second driving power bridge line EVDD_B2 and the auxiliary reference lines VREF_H overlap each other. In addition, the welding process may be performed for the welding area VREF_WD (corresponding to GL_WD of FIGS. 4 and 5) positioned in an area where the first reference bridge line VREF_B1 and the gate line GL overlap each other and the welding area VREF_WD positioned in an area where the first reference bridge line VREF_B1 and the auxiliary reference lines VREF_H overlap each other.

Then, the second driving power bridge line EVDD_B2 and the first reference bridge line VREF_B1 may be used as a bypass path of the disconnected gate line GL. Also, the gate signal supplied from the gate line GL of a previous portion of the disconnected gate line GL may be applied to the auxiliary reference line VREF_H through the second driving power bridge line EVDD_B2, the gate signal passing through the auxiliary reference line VREF_H may be applied to the first reference bridge line VREF_B1, and the gate signal passing through the first reference bridge line VREF_B1 may be transferred to the gate line GL of a subsequent portion of the disconnected gate line GL.

Figure 7:
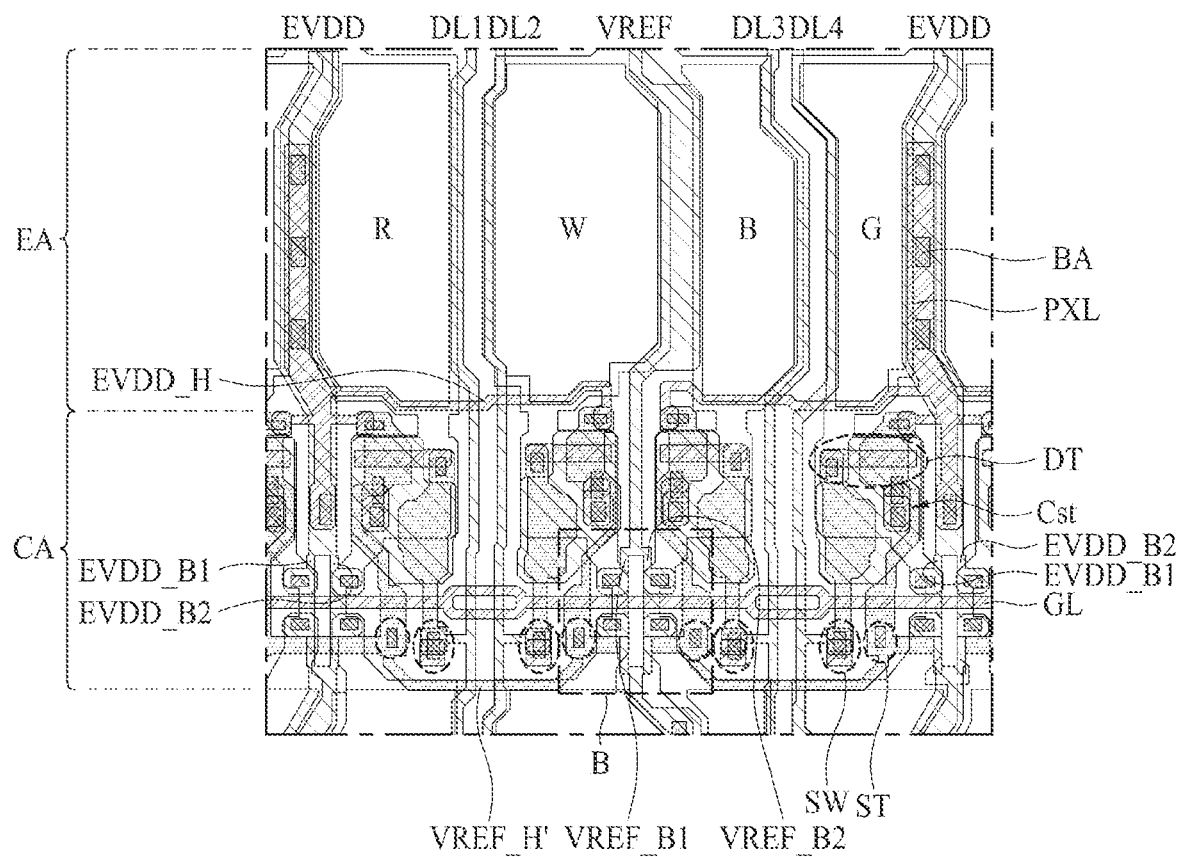
FIG. 7 is a plane view illustrating a unit pixel of a light emitting display device according to another embodiment of the present disclosure.
Figure 8:
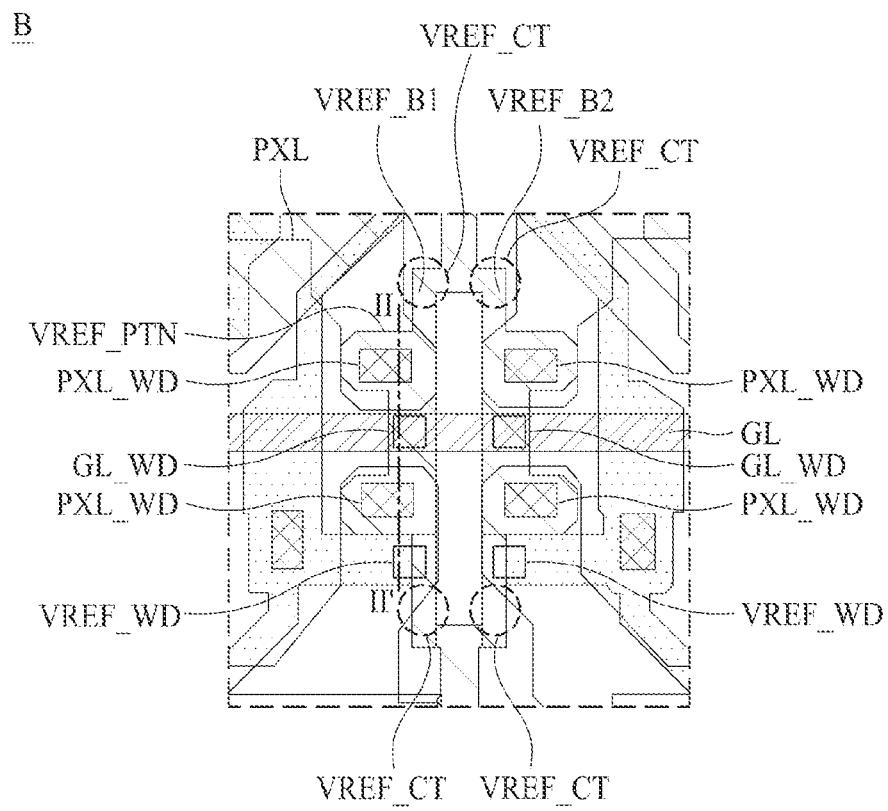
FIG. 8 is an enlarged view illustrating a portion B of FIG. 7.
Figure 9:
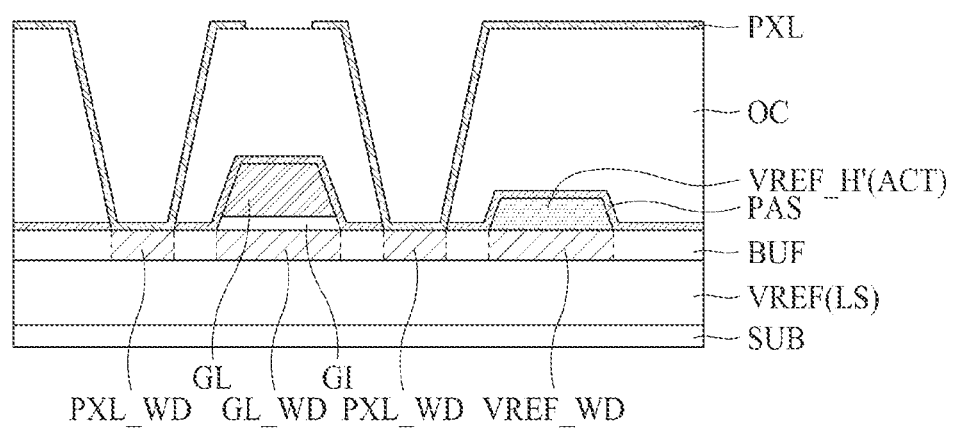
FIG. 9 is a cross-sectional view taken along line II-II' of FIG. 8.
Figure 10:
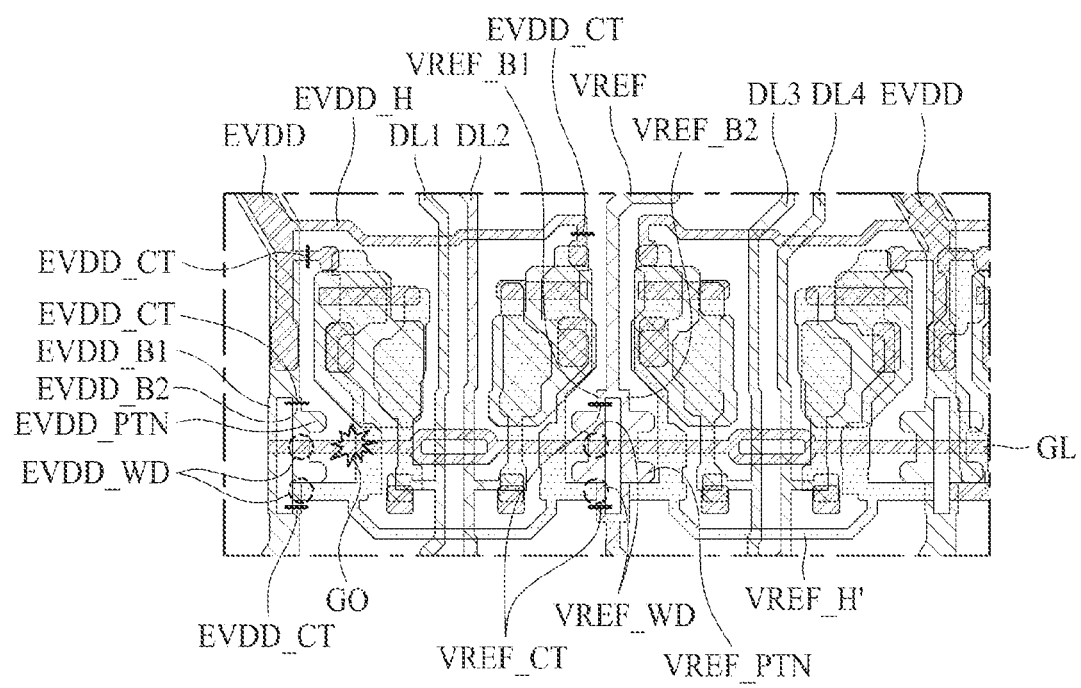
FIG. 10 is a view illustrating a repair process of a light emitting display device according to another embodiment of the present disclosure.

FIG. 7 is a plane view illustrating a unit pixel of a light emitting display device according to another embodiment of the present disclosure. FIG. 8 is an enlarged view illustrating a portion B of FIG. 7. FIG. 9 is a cross-sectional view taken along line II-II' of FIG. 8. FIG. 10 is a view illustrating a repair process of a light emitting display device according to another embodiment of the present disclosure. In FIGS. 7 to 10, the auxiliary reference line in the light emitting display device according to one embodiment of the present disclosure shown in FIGS. 3 to 6 is modified to an active layer. Therefore, only the element modified from FIGS. 3 to 6 will be described in detail, and the duplicated description of the other same elements will be omitted.

Referring to FIGS. 7 to 9, the light emitting display device according to another embodiment of the present disclosure may include first to fourth (four) subpixels SP1, SP2, SP3 and SP4 which constitute one unit pixel and are indicated by R, W, B and G in FIG. 7, respectively, a plurality of driving power lines EVDD, data lines DL1, DL2, DL3 and DL4, a gate line GL and a reference line VREF.

In the display device according to another embodiment of the present disclosure, the reference line VREF may be disposed between the plurality of driving power lines EVDD, and may extend along the second direction (or vertical direction). For example, the reference line VREF may be disposed in parallel with the driving power lines EVDD between the second subpixel SP2 and the third subpixel SP3.

The reference line VREF may include a conductive auxiliary reference line VREF_H' which extends so that an active layer constituting the sensing thin film transistor ST may be connected to the reference line VREF.

A portion of the auxiliary reference line VREF_H', which extends to one side (or left side) from the reference line VREF, may overlap the second driving power bridge line EVDD_B2 of the driving power line EVDD positioned at the left side. The auxiliary reference line VREF_H' may overlap the first reference bridge line VREF_B1 of the reference line VREF.

A portion of the auxiliary reference line VREF_H', which extends to the other side (or right side) from the reference line VREF may overlap the first driving power bridge line EVDD_B1 of the driving power line EVDD positioned at the right side. The auxiliary reference line VREF_H' may overlap the second reference bridge line VREF_B2 of the reference line VREF.

The first driving power bridge line EVDD_B1 of the driving power line EVDD positioned at the left side may overlap the auxiliary reference line VREF_H' of another pixel, which is adjacent thereto at the left side and disposed on the same horizontal line.

The second driving power bridge line EVDD_B2 of the driving power line EVDD positioned at the right side may overlap the auxiliary reference line VREF_H' of another pixel, which is adjacent thereto at the right side and disposed on the same horizontal line.

The auxiliary reference line VREF_H' may overlap only one of the first driving power bridge line EVDD_B1 or the second driving power bridge line EVDD_B2 of the driving power line EVDD. Each of the first and second driving power bridge lines EVDD_B1 and EVDD_B2 belonging to the same driving power line EVDD may overlap the auxiliary reference line VREF_H'. For example, the auxiliary reference lines VREF_H' extending from different reference lines VREF may overlap each of the first and second driving power bridge lines EVDD_B1 and EVDD_B2 belonging to the same driving power line EVDD.

The auxiliary reference line VREF_H' may overlap only one of the first reference bridge line VREF_B1 or the second reference bridge line VREF_B2 of the reference line VREF. Each of the first and second reference bridge lines VREF_B1 and VREF_B2 belonging to the same reference line VREF may overlap the auxiliary reference line VREF_H'. For example, each of the first and second reference bridge lines VREF_B1 and VREF_B2 belonging to the same reference line VREF may overlap the auxiliary reference line VREF_H' extending from the reference line VREF in different directions.

The auxiliary reference line VREF_H' may be formed in a single structure of a conductive active layer, but is not limited thereto, and may be formed of an active multi-layered structure in which the conductive active layer and at least one metal material are deposited. For example, the active multi-layered film may be formed of a triple layer of Cu/MoTi/active layer or a double layer of MoTi/Active layer.

Referring to FIGS. 8 and 9, the reference line VREF according to another embodiment of the present disclosure may diverge into a first reference bridge line VREF_B1 (or first power bridge line) and a second reference bridge line VREF_B2 (or second power bridge line), which are spaced apart from each other in the first direction (or horizontal direction) in some segments, and the first and second reference bridge lines may extend in the second direction (or vertical direction) and then be integrally connected to each other.

The first and second reference bridge lines VREF_B1 and VREF_B2 may include their respective reference protrusion patterns VREF_PTN (or protrusion patterns) protruding to be opposite to each other.

As shown in FIG. 8, a cutting area VREF_CT and welding areas GL_WD and VREF_WD may be disposed in the first and second reference bridge lines VREF_B1 and VREF_B2 to repair disconnection (open) of the gate line GL when the disconnection occurs in the gate line GL.

The cutting area VREF_CT may be positioned at a portion adjacent to the reference line VREF at both ends of the first reference bridge line VREF_B1 and the second reference bridge line VREF_B2.

The welding areas GL_WD and VREF_WD may be positioned at a portion overlapped with the gate line GL and a portion overlapped with the auxiliary reference line VREF_H in the first reference bridge line VREF_B1 and the second reference bridge line VREF_B2. For example, a welding process for the welding areas GL_WD and VREF_WD may be performed after cutting of the cutting area VREF_CT has been performed.

The welding area PXL_WD for the pixel electrode PXL may be disposed in the reference protrusion pattern VREF_PTN (or protrusion pattern) protruded from the first and second reference bridge lines VREF_B1 and VREF_B2.

As shown in FIG. 9, the first and second reference bridge lines VREF_B1 and VREF_B2 may be disposed on the substrate SUB. The first and second reference bridge lines VREF_B1 and VREF_B2 may be formed by a light shielding layer LS. A buffer layer BUF and a gate insulating layer GI may be disposed on the first and second reference bridge lines VREF_B1 and VREF_B2. The gate line GL and the auxiliary reference line VREF_H' may be disposed on the gate insulating layer GI. The auxiliary reference line VREF_H' may be formed in a single structure of a conductive active layer, but is not limited thereto, and may be formed of an active multi-layered structure in which the conductive active layer and at least one metal material are deposited. For example, the active multi-layered film may be formed of a triple layer of Cu/MoTi/active layer or a double layer of MoTi/active layer.

A passivation layer PAS may be disposed on the gate line GL and the auxiliary reference line VREF_H' to electrically protect the gate line GL and the auxiliary reference line VREF_H'. An overcoat layer OC may be disposed on the passivation layer PAS, and the pixel electrode PXL may be disposed on the overcoat layer OC.

The buffer layer BUF, the gate insulating layer GI, the passivation layer PAS, the overcoat layer OC, etc. may be disposed between the reference protrusion pattern VREF_PTN (or protrusion pattern) of the first and second reference bridge lines VREF_B1 and VREF_B2 and the pixel electrode PXL as at least one insulating layer. At this time, the welding area PXL_WD of the pixel electrode PXL may include a groove in which a portion of at least one insulating layer is recessed. For example, the groove passes through the overcoat layer OC and the passivation layer PAS, and the pixel electrode PXL corresponding to the groove may be disposed on the buffer layer BUF in contact with the buffer layer BUF. This is to make welding more actively and prevent other elements from being damaged by making the distance between the first and second reference bridge lines VREF_B1 and VREF_B2 and the pixel electrode PXL close when the laser is irradiated from the lower portion of the substrate for the welding process.

A repair process in which disconnection occurs in a gate line in a light emitting display device according to another embodiment of the present disclosure will be described with reference to FIG. 10.

In FIG. 10, it is assumed that a disconnection defect GO of the gate line GL occurs in the first subpixel SP1. The first subpixel SP1 in which the disconnected gate line GL is positioned and the second subpixel SP2 adjacent to the first subpixel SP1 may be dark point areas for repairing the disconnection defect of the gate line GL.

A cutting area EVDD_CT positioned at both ends of the second driving power bridge line EVDD_B2 of the driving power line EVDD overlapped with a previous portion of the disconnected gate line GL may be cut. A cutting area VREF_CT positioned at both ends of the first reference bridge line VREF_B1 of the reference line VREF that is overlapped with a subsequent portion of the disconnected gate line GL may be cut.

According to another embodiment of the present disclosure, the auxiliary reference line VREF_H' is formed by making the active layer extending from the sensing thin film transistor ST conductive, whereby the active cutting area CAT_CT positioned below the gate line may be cut to use the auxiliary reference line VREF_H' as a bypass path of the disconnected gate line GL.

In addition, since the functions of the first subpixel SP1 and the second subpixel SP2 have been lost, the cutting area EVDD_CT may be cut for the auxiliary driving power line EVDD_H for applying a driving power to the driving thin film transistor DT. In this case, cutting may be omitted depending on the conditions of the repair process.

Then, the welding process may be performed for the welding area EVDD_WD positioned in an area where the second driving power bridge line EVDD_B2 and the gate line GL overlap each other and an area where the second driving power bridge line EVDD_B2 and the auxiliary reference lines VREF_H' overlap each other. In addition, welding process may be performed for the welding area VREF_WD (corresponding to GL_WD of FIGS. 8 and 9) positioned in an area where the first reference bridge line VREF_B1 and the gate line GL overlap each other and the welding area VREF_WD positioned in an area where the first reference bridge line VREF_B1 and the auxiliary reference lines VREF_H' overlap each other.

Then, as a bypass path of the disconnected gate line GL, the second driving power bridge line EVDD_B2 and the first reference bridge line VREF_B1 may be used. Also, the gate signal supplied from the gate line GL of a previous portion of the disconnected gate line GL may be applied to the auxiliary reference line VREF_H' through the second driving power bridge line EVDD_B2, the gate signal passing through the auxiliary reference line VREF_H' may be applied to the first reference bridge line VREF_B1, and the gate signal passing through the first reference bridge line VREF_B1 may be transferred to the gate line GL of a subsequent portion of the disconnected gate line GL.

Figure 11:
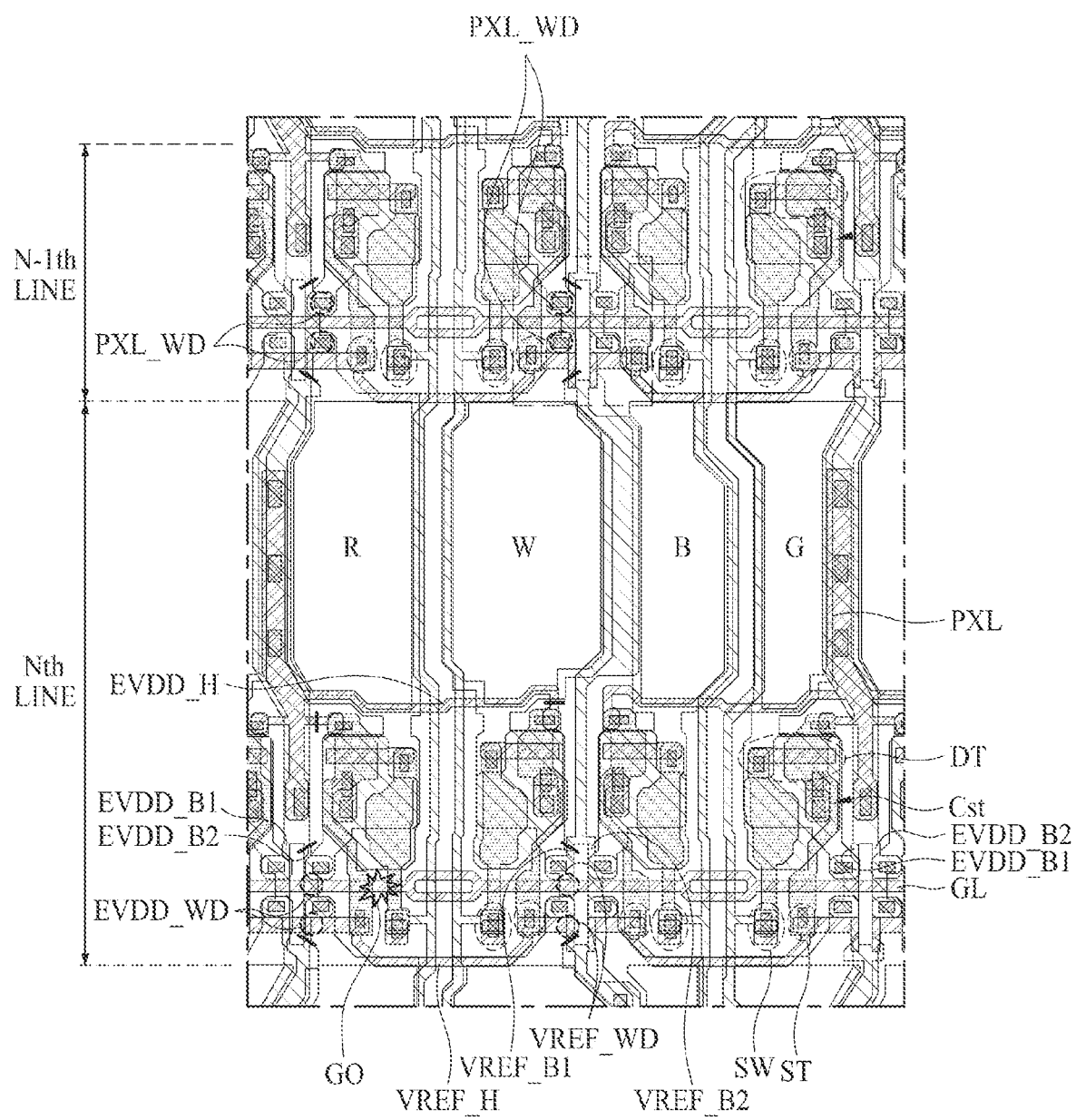
FIG. 11 is a view illustrating a repair process of a light emitting display device according to other embodiment of the present disclosure.

FIG. 11 is a view illustrating a repair process of a light emitting display device according to other embodiment of the present disclosure.

According to the repair process shown in FIGS. 6 and 10, the first subpixel SP1 in which a disconnection defect GO of the gate line GL occurs and the second subpixel SP2 adjacent to the first subpixel SP1 may be dark point areas for repairing the disconnection defect of the gate line GL.

In the light emitting display device according to other embodiment of the present disclosure, a repair process of repairing dark points of the first subpixel SP and the second subpixel SP while solving a disconnection defect GO of the gate line GL will be described with reference to FIG. 11.

In FIG. 11, it is assumed that the disconnection defect GO of the gate line GL occurs in an Nth horizontal line (N line). The first subpixel SP1 of the Nth horizontal line in which the disconnected gate line GL is positioned and the second subpixel SP2 adjacent to the first subpixel SP1 may be dark point areas for repairing the disconnection defect of the gate line GL. However, according to other embodiment of the present disclosure, the dark points of the first subpixel SP1 and the second subpixel SP2, which are disposed in the Nth horizontal line (N line), may be repaired through the welding area PXL_WD of the pixel electrode PXL corresponding to the first subpixel SP1 and the second subpixel SP2, which are disposed in an (N−1)th horizontal line (N−1 line).

According to other embodiment of the present disclosure, the disconnection defect of the gate line GL may be repaired even though the subpixel does not become a dark point area.

For example, the repair process of the disconnection defect of the gate line GL may substantially be the same as the repair process shown in FIGS. 6 and 10. However, in addition to the repair process shown in FIGS. 6 and 10, the cutting area EVDD_CT positioned at both ends of the first driving power bridge line EVDD_B1 of the driving power line EVDD may be cut such that the pixel electrode PXL extending from the first subpixel SP1 of the Nth horizontal line may be electrically connected with the pixel electrode extending from the first subpixel SP1 of the (N−1)th horizontal line, and the welding process for the welding area PXL_WD of the pixel electrode PXL of the first driving power bridge line EVDD_B1 may be performed, whereby the dark point may be repaired. The welding process may equally be performed in the second subpixel SP2.

The light emitting display device according to various embodiments of the present disclosure may be described as follows.

The light emitting display device according to various embodiments of the present disclosure may comprise a subpixel having a light emitting element disposed in a light emission area on a substrate and a circuit area in which a circuit for driving the light emitting element is disposed, a gate line disposed in the circuit area in a first direction, and at least one power line disposed in a second direction crossing the first direction, having a first power bridge line and a second power bridge line, which are spaced apart from each other in the first direction.

In the light emitting display device according to various embodiments of the present disclosure, the first and second power bridge lines may be disposed to overlap the gate line.

In the light emitting display device according to various embodiments of the present disclosure, a central portion of the first and second power bridge lines may overlap the gate line.

In the light emitting display device according to various embodiments of the present disclosure, one end of the first power bridge line and one end of the second power bridge line may be integrally connected to each other, and the other end of the first power bridge line and the other end of the second power bridge line may be integrally connected to each other.

In the light emitting display device according to various embodiments of the present disclosure, the at least one power line may further include an auxiliary power line extending in the first direction, and the auxiliary power line may be individually connected to each of the first and second power bridge lines.

In the light emitting display device according to various embodiments of the present disclosure, the at least one power line may include a driving power line for supplying a driving power source to the light emitting element, and a reference line for supplying a reference power source to the light emitting element, and the auxiliary power line may extend from the reference line.

In the light emitting display device according to various embodiments of the present disclosure, the auxiliary power line may include a conductive active layer.

In the light emitting display device according to various embodiments of the present disclosure, the auxiliary power line is multi-layered and may include the conductive active layer and at least one metal material layer.

In the light emitting display device according to various embodiments of the present disclosure, the first and second power bridge lines may include their respective protrusion patterns protruded in a first direction to be opposite to each other.

In the light emitting display device according to various embodiments of the present disclosure, the protrusion patterns may be respectively disposed at both sides of the gate line.

In the light emitting display device according to various embodiments of the present disclosure, the protrusion pattern may overlap a pixel electrode of the light emitting element.

In the light emitting display device according to various embodiments of the present disclosure, at least one insulating layer may be disposed between the protrusion pattern and the pixel electrode, and a groove formed by recessing a portion of the at least one insulating layer may be included between the protrusion pattern and the pixel electrode.

In the light emitting display device according to various embodiments of the present disclosure, the protrusion pattern may include a first protrusion pattern at an upper portion of the gate line and a second protrusion pattern at a lower portion of the gate line, wherein the first protrusion pattern may overlap a pixel electrode of a first subpixel disposed on an upper horizontal line, and the second protrusion pattern may overlap a pixel electrode of a second subpixel disposed on a lower horizontal line.

The light emitting display device according to various embodiments of the present disclosure may comprise a plurality of subpixels disposed in a pixel area defined by a gate line, a data line, a driving power line and a reference line, each subpixel having a light emission area and a circuit area, wherein the gate line may be disposed in the circuit area along a first direction, the driving power line and the reference line may be disposed in parallel in a second direction crossing the first direction, the driving power line may include a first driving power bridge line and a second driving power bridge line, which are spaced apart from each other in a length direction of the gate line and extend in the second direction, and the reference line may include a first reference bridge line and a second reference bridge line, which are spaced apart from each other in the length direction of the gate line and extend in the second direction.

In the light emitting display device according to various embodiments of the present disclosure, the plurality of subpixels may include first, second, third and fourth subpixels sequentially arranged along the first direction, a first driving power line and a second driving line are respectively disposed at a left side of the first subpixel and a right side of the fourth subpixel in parallel, the reference line may be disposed in parallel with the driving power line between the second subpixel and the third subpixel, the reference line may include auxiliary reference lines respectively extending in a direction toward the first subpixel and a direction toward the fourth subpixel, and one side of the auxiliary reference line may overlap the second driving power bridge line of the first driving power line and the first reference bridge line of the reference line and the other side of the auxiliary reference line may overlap the second reference bridge line of the reference line and the first driving power bridge line of the second driving power line.

In the light emitting display device according to various embodiments of the present disclosure, the first driving power bridge line of the first driving power line may overlap an auxiliary reference line of another pixel, which is adjacent thereto at a left side and disposed on the same horizontal line, and the second driving power bridge line of the second driving power line may overlap an auxiliary reference line of another pixel, which is adjacent thereto at a right side and disposed on the same horizontal line.

In the light emitting display device according to various embodiments of the present disclosure, a central portion of the first and second driving power bridge lines and the first and second reference bridge lines may overlap the gate line.

In the light emitting display device according to various embodiments of the present disclosure, the first and second driving power bridge lines may include their respective driving power protrusion patterns protruding to be opposite to each other, and the first and second reference bridge lines may include their respective reference protrusion patterns protruding to be opposite to each other.

In the light emitting display device according to various embodiments of the present disclosure, the driving power protrusion pattern may include a first driving power protrusion pattern at an upper portion of the gate line and a second driving power protrusion pattern at a lower portion of the gate line interposed between the first and second driving power protrusion patterns, the reference protrusion pattern may include a first reference protrusion pattern at an upper portion of the gate line and a second reference protrusion pattern at a lower portion of the gate line interposed between the first and second reference protrusion patterns, and each of the first and second driving power protrusion patterns and each of the first and second reference protrusion patterns may overlap their respective pixel electrodes of different subpixels.

In the light emitting display device according to various embodiments of the present disclosure, at least one insulating layer may be disposed between the pixel electrodes and each of the first and second driving power protrusion patterns and the first and second reference protrusion patterns, and a groove formed by recessing a portion of the at least one insulating layer may be included between the pixel electrodes and each of the first and second driving power protrusion patterns and the first and second reference protrusion patterns.

According to the present disclosure, the following advantageous effects may be obtained.

The light emitting display device according to the present disclosure may improve an aperture ratio in a limited space of a subpixel, and may provide an improved repair structure in which a repair process may be performed in response to various types of defects.

It will be apparent to those skilled in the art that the present disclosure described above is not limited by the above-described embodiments and the accompanying drawings and that various substitutions, modifications and variations can be made to the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display device comprising:
a subpixel having a light emitting element disposed in a light emission area on a substrate and a circuit area in which a circuit for driving the light emitting element is disposed;
a gate line disposed in the circuit area in a first direction; and
at least one power line disposed in a second direction crossing the first direction, the at least one power line including a first power bridge line and a second power bridge line which are spaced apart from each other in the first direction;
wherein a first end of the first power bridge line and a first end of the second power bridge line are integrally connected to each other, and a second end of the first power bridge line and a second end of the second power bridge line are integrally connected to each other,
wherein the at least one power line further includes an auxiliary power line extending in the first direction, and the auxiliary power line is individually connected to each of the first and second power bridge lines.

2. The light emitting display device of claim 1, wherein the first and second power bridge lines are disposed to overlap the gate line.

3. The light emitting display device of claim 2, wherein a central portion of the first and second power bridge lines overlaps the gate line.

4. The light emitting display device of claim 3, wherein the first and second power bridge lines include their respective protrusion patterns protruding in a first direction to be opposite to each other.

5. The light emitting display device of claim 4, wherein the protrusion patterns are respectively disposed at both sides of the gate line.

6. The light emitting display device of claim 5, wherein the protrusion pattern overlaps a pixel electrode of the light emitting element.

7. The light emitting display device of claim 6, wherein at least one insulating layer is disposed between the protrusion pattern and the pixel electrode, and a groove formed by recessing a portion of the at least one insulating layer is included between the protrusion pattern and the pixel electrode.

8. The light emitting display device of claim 7, wherein the protrusion pattern includes a first protrusion pattern at an upper portion of the gate line and a second protrusion pattern at a lower portion of the gate line,
the first protrusion pattern overlaps a pixel electrode of a first subpixel disposed on an upper horizontal line, and
the second protrusion pattern overlaps a pixel electrode of a second subpixel disposed on a lower horizontal line.

9. The light emitting display device of claim 1, wherein the at least one power line further includes:
a driving power line for supplying a driving power source to the light emitting element; and
a reference line for supplying a reference power source to the light emitting element, and
the auxiliary power line extends from the reference line.

10. The light emitting display device of claim 9, wherein the auxiliary power line includes a conductive active layer.

11. The light emitting display device of claim 10, wherein the auxiliary power line further includes at least one metal material layer, and the auxiliary power line is multi-layered.

12. A light emitting display device comprising a plurality of subpixels disposed in a pixel area defined by a gate line, a data line, a driving power line and a reference line, each subpixel having a light emission area and a circuit area,
wherein the gate line is disposed in the circuit area along a first direction,
the driving power line and the reference line are disposed in parallel in a second direction crossing the first direction,
the driving power line includes a first driving power bridge line and a second driving power bridge line, which extend in the second direction and are spaced apart from each other in a length direction of the gate line, and
the reference line includes a first reference bridge line and a second reference bridge line, which extend in the second direction and are spaced apart from each other in the length direction of the gate line;
wherein the plurality of subpixels include first, second, third and fourth subpixels sequentially arranged along the first direction,
a first driving power line and a second driving line are respectively disposed at a left side of the first subpixel and a right side of the fourth subpixel in parallel,
the reference line is disposed in parallel with the driving power line between the second subpixel and the third subpixel,
the reference line includes auxiliary reference lines respectively extending in a direction toward the first subpixel and a direction toward the fourth subpixel, and
a first side of the auxiliary reference line overlaps the second driving power bridge line of the first driving power line and the first reference bridge line of the reference line and a second side of the auxiliary reference line overlaps the second reference bridge line of the reference line and the first driving power bridge line of the second driving power line.

13. The light emitting display device of claim 12, wherein the first driving power bridge line of the first driving power line overlaps an auxiliary reference line of another pixel, which is adjacent thereto at a left side and disposed on the same horizontal line, and
the second driving power bridge line of the second driving power line overlaps an auxiliary reference line of another pixel, which is adjacent thereto at a right side and disposed on the same horizontal line.

14. The light emitting display device of claim 13, wherein a central portion of the first and second driving power bridge lines and the first and second reference bridge lines overlap the gate line.

15. The light emitting display device of claim 14, wherein the first and second driving power bridge lines include their respective driving power protrusion patterns protruding to be opposite to each other, and
the first and second reference bridge lines include their respective reference protrusion patterns protruding to be opposite to each other.

16. The light emitting display device of claim 15, wherein the driving power protrusion pattern includes a first driving power protrusion pattern at an upper portion of the gate line and a second driving power protrusion pattern at a lower portion of the gate line interposed between the first and second driving power protrusion patterns,
the reference protrusion pattern includes a first reference protrusion pattern at an upper portion of the gate line and a second reference protrusion pattern at a lower portion of the gate line interposed between the first and second reference protrusion patterns, and
each of the first and second driving power protrusion patterns and each of the first and second reference protrusion patterns overlap their respective pixel electrodes of different subpixels.

17. The light emitting display device of claim 16, wherein at least one insulating layer is disposed between the pixel electrodes and each of the first and second driving power protrusion patterns and the first and second reference protrusion patterns, and a groove formed by recessing a portion of the at least one insulating layer is included between the pixel electrodes and each of the first and second driving power protrusion patterns and the first and second reference protrusion patterns.

* * * * *